(12) United States Patent
Forbes

(10) Patent No.: US 9,281,065 B2
(45) Date of Patent: Mar. 8, 2016

(54) LOW-POWER NONVOLATILE MEMORY CELLS WITH SELECT GATES

(71) Applicant: Empire Technology Development LLC, Wilmington, DE (US)

(72) Inventor: Leonard Forbes, Corvallis, OR (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 0 days.

(21) Appl. No.: 14/456,965

(22) Filed: Aug. 11, 2014

(65) Prior Publication Data

US 2016/0042793 A1  Feb. 11, 2016

(51) Int. Cl.
*G11C 16/04* (2006.01)
*G11C 16/06* (2006.01)

(52) U.S. Cl.
CPC ..................................... *G11C 16/06* (2013.01)

(58) Field of Classification Search
USPC ......................... 365/185.05, 185.18, 185.26; 257/E21.628, E27.103, E29.129
See application file for complete search history.

(56) References Cited

U.S. PATENT DOCUMENTS

| | | | |
|---|---|---|---|
| 6,104,068 A | 8/2000 | Forbes | |
| 6,124,729 A | 9/2000 | Noble et al. | |
| 6,150,687 A | 11/2000 | Noble et al. | |
| 6,208,164 B1 | 3/2001 | Noble et al. | |
| 6,355,961 B1 | 3/2002 | Forbes | |
| 6,413,825 B1 | 7/2002 | Forbes | |
| 6,433,382 B1 * | 8/2002 | Orlowski et al. | 257/315 |
| 6,774,428 B1 * | 8/2004 | Hung et al. | 257/315 |
| 7,348,642 B2 | 3/2008 | Nowak | |
| 8,513,102 B2 | 8/2013 | Forbes et al. | |
| 8,823,076 B2 * | 9/2014 | Lee et al. | 257/321 |
| 2014/0048867 A1 * | 2/2014 | Toh et al. | 257/324 |

OTHER PUBLICATIONS

Dreslinski, R.G. et al., "Near-threshold computing: reclaiming Moore's law through energy efficient integrated circuits," Proc. of the IEEE, vol. 98, No. 2, pp. 253-266, Feb. 2010.
Forbes, L. et al., "Single Election Trapping in Nanoscale Transistors; RTS(Random Telegraph Signals) and I/f Noise," NanoTech, vol. 4, pp. 559-562 (2007).
Forbes, L. et al., "Thermal noise and bit error rate limits in nanoscale memories," IEEE Electronics Letters, vol. 42, No. 5, pp. 279-280, Mar. 2, 2006.
Forbes, L. et al.,"1/f Noise and RTS(Random Telegraph Signal) Errors in Comparators and Sense Amplifiers," NanoTech, vol. 1, pp. 197-200 (2007).

(Continued)

*Primary Examiner* — Vu Le
(74) *Attorney, Agent, or Firm* — Turk IP Law, LLC

(57) ABSTRACT

Technologies are generally described for low-power nonvolatile memory cells configured with select gates. A nonvolatile memory cell may have a transistor body, a select gate and a floating gate both coupled to the body, and a control gate coupled to the floating gate. Charge stored on the floating gate may indicate the data stored on the memory cell, and the control gate may be configured to adjust the charge stored on the floating gate. The select gate may be used to adjust the state of the transistor body to facilitate the adjustment of charge on the floating gate, and may also be used to render the memory cell unresponsive to the control gate.

23 Claims, 12 Drawing Sheets

(56) References Cited

OTHER PUBLICATIONS

Forbes, L., and Miller, D. A., "A Percolation Model for Random Telegraph Signals in Metal-Oxide-Silicon Field Effect Transistor Drain Current", Appl. Phys. Lett., vol. 93, No. 4, pp. 043517-043517-3, Aug. 1, 2008.

Jan, C-H. et al., "A 22nm SoC Platform Technology Featuring 3-D Tri-Gate and High-k/Metal Gate, Optimized for Ultra Low Power, High Performance and High Density SoC Applications," IEEE International Electron Device Meeting, San Francisco, pp. 3.1.1-3.1.4, Dec. 10-13, 2012.

Kish, L.B., "End of Moore's law: thermal (noise) death of integration in micro and nano electronics," Physics Letters A, vol. 305, No. 3-4, pp. 144-149, Sep. 2002.

Miller, D. A. et al., "Subthreshold leakage due to 1/f noise and RTS(random telegraph signals)," IEEE Workshop on Microelectronics and Electron Devices, pp. 23-24, Apr. 20, 2007.

Sarkar, J., et al., "Vertical Flash Memory Cell With Nanocrystal Floating Gate for Ultradense Integration and Good Retention," IEEE, Electron Device Letters, vol. 28, Issue 5, pp. 449-451, May 2007.

Tega, N. et al., "Anomalously Large Threshold Voltage Fluctuation by Complex Random Telegraph Signal in Floating Gate Flash Memory," IEEE Int. Electron Devices Meeting, pp. 1-4, Dec. 11-13, 2006.

* cited by examiner

COMPUTER PROGRAM PRODUCT 1200

SIGNAL-BEARING MEDIUM 1202

1204 AT LEAST ONE OF

ONE OR MORE INSTRUCTIONS TO DETERMINE AN OPERATION TO BE PERFORMED ON A NONVOLATILE MEMORY CELL HAVING A SELECT GATE;
  ONE OR MORE INSTRUCTIONS TO SELECT A POTENTIAL TO BE APPLIED TO THE SELECT GATE BASED ON THE DETERMINED OPERATION;
  ONE OR MORE INSTRUCTIONS TO APPLY THE SELECTED POTENTIAL TO THE SELECT GATE; AND
  ONE OR MORE INSTRUCTIONS TO ADJUST THE CHARGE STORED AT THE MEMORY CELL BASED ON THE DETERMINED OPERATION AND A MEMORY CELL STATE CORRESPONDING TO THE SELECTED POTENTIAL.

| COMPUTER-READABLE MEDIUM 1206 | RECORDABLE MEDIUM 1208 | COMMUNICATIONS MEDIUM 1210 |

FIG. 12

LOW-POWER NONVOLATILE MEMORY CELLS WITH SELECT GATES

BACKGROUND

Unless otherwise indicated herein, the materials described in this section are not prior art to the claims in this application and are not admitted to be prior art by inclusion in this section.

A lower limit on energy spent in a computing operation may be determined by a requirement that the generated electrical signal be larger than the noise. There are typically two major sources of noise in electrical system, thermal noise and random telegraph signal (RTS) or 1/f noise. The signal to noise ratio in electrical systems is proportional to the excess of the signal over the noise, which is typically inversely proportional to the bit error rate (BER).

Energy efficient computing circuits may use low power supply voltages and low signal voltage levels while still maintaining a desirable BER. Power dissipation, or energy consumption, in logic circuits may depend upon the square of the magnitude of the signal level (e.g., voltage) in comparison to the square of the magnitude of the thermal noise, and linearly upon the frequency of operation of the logic circuits. Various techniques available to reduce thermal noise, to increase the signal to noise ratio, may include lower bandwidths of operation, lower speed computing circuit operations, or lower temperatures of operation.

SUMMARY

The following summary is illustrative only and is not intended to be in any way limiting. In addition to the illustrative aspects, embodiments, and features described above, further aspects, embodiments, and features will become apparent by reference to the drawings and the following detailed description.

The present disclosure generally describes techniques to adjust low-power nonvolatile memory cells configured with select gates.

According to some examples, methods to adjust a nonvolatile memory cell having a transistor body, a select gate coupled to the body, a floating gate coupled to the body, and a control gate coupled to the floating gate are described. Example methods may include determining an operation to be performed on the memory cell; selecting a potential from a plurality of potentials based on the determined operation to be performed, where each potential in the plurality of potentials corresponds to a respective body state of the transistor body; and applying the selected potential to the select gate. Example methods may also include adjusting a number of electrons stored on the floating gate responsive to the control gate based on the determined operation and the body state that corresponds to the selected potential applied to the select gate.

According to other examples, nonvolatile memory cells are described. Example nonvolatile memory cells may include a transistor body, a floating gate coupled to the transistor body and configured to store electrons, a select gate coupled to the transistor body, and a control gate coupled to the floating gate. The select gate may be configured to receive a signal based on an operation to be performed on the memory cell and apply a potential associated with the received signal to the transistor body. The control gate may be configured to receive a control signal associated with the operation and adjust a number of electrons stored on the floating gate based on the control signal and the potential applied to the transistor body by the select gate.

According to further examples, logic array modules are described. Example logic array modules may include a plurality of nonvolatile memory cells, each nonvolatile memory cell including a transistor body, a floating gate coupled to the transistor body and configured to store electrons, a control gate coupled to the floating gate, and a select gate coupled to the transistor body. Each of the logic array modules may also include a processor block coupled to the plurality of nonvolatile memory cells. The processor block may be configured to determine a memory operation to be performed; select a nonvolatile memory cell from the plurality of nonvolatile memory cells based on the determined memory operation to be performed; and for each of the selected nonvolatile memory cells: determine a cell operation to be performed on the memory cell based on the determined memory operation to be performed; apply a potential selected from a plurality of potentials based on the determined cell operation to be performed to the select gate of the selected memory cell, where each potential in the plurality of potentials corresponds to a respective body state of the transistor body; and adjust a number of electrons stored on the floating gate of the memory cell through the control gate of the memory cell based on the determined cell operation to be performed and the body state corresponding to the potential applied to the select gate of the memory cell.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 12 illustrates a block diagram of an example computer program product, all arranged in accordance with at least some embodiments as described herein.

DETAILED DESCRIPTION

Figure 1A:
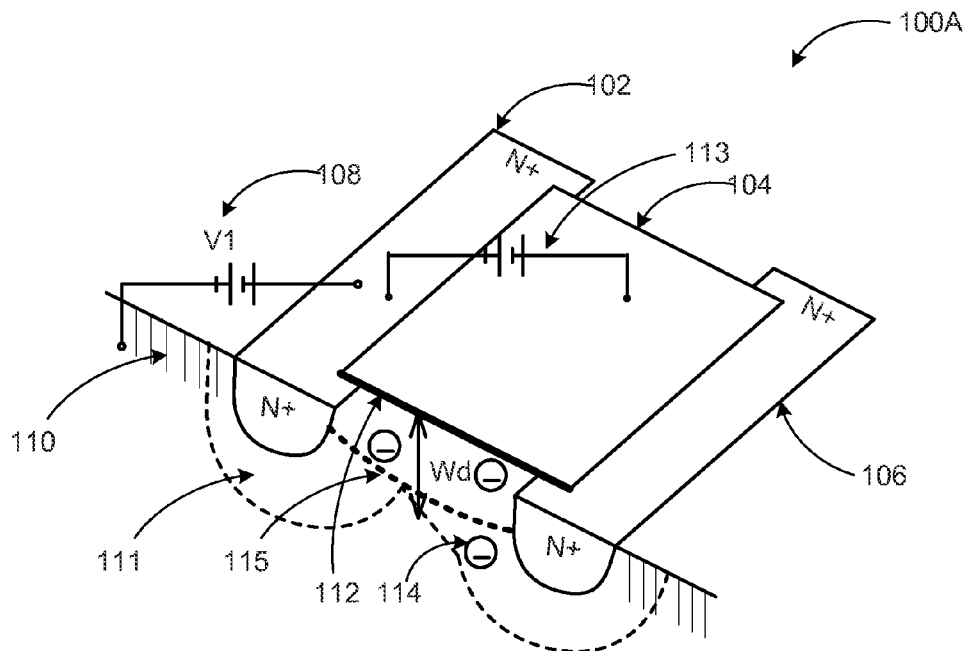
FIGS. 1A and 1B illustrate an example planar complementary metal-oxide semiconductor (CMOS) field-effect transistor (FET) and a graph of potential variations at a surface of a semiconductor in a channel region of the FET.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of different configurations, all of which are explicitly contemplated herein.

This disclosure is generally drawn, among other things, to methods, apparatus, systems, devices, and/or computer program products related to energy efficient computing by accounting for charge storage in non-volatile random access flash memories.

Briefly stated, technologies are generally described for low-power nonvolatile memory cells configured with select gates. A nonvolatile memory cell may have a transistor body, a select gate and a floating gate both coupled to the body, and a control gate coupled to the floating gate. Charge stored on the floating gate may indicate the data stored on the memory cell, and the control gate may be configured to adjust the charge stored on the floating gate. The select gate may be used to adjust the state of the transistor body to facilitate the adjustment of charge on the floating gate, and may also be used to render the memory cell unresponsive to the control gate.

Energy efficient computing circuits may use low power supply voltages and low signal voltage levels while still maintaining desirable BERs. Power dissipation or energy consumption in logic circuits may vary as the square of the magnitude of the signal voltage and linearly according to the frequency of operation. There are two main sources of noise, thermal noise and 1/f noise (also known as random telegraph signal noise). A larger ratio of signal to noise may result in a lower BER. A desirable BER may be one per year.

Thermal noise may be due to random motion of electrons in a conductor. Thermal noise voltage may be characterized as $V_n = kT/q$, where k is Boltzmann's constant, T is temperature in Kelvin, and q is electronic charge. The thermal noise voltage may set a lower limit on power supply voltage and signal levels in static CMOS logic and memory circuits. Logic circuit BER may be determined by an exponential relationship described by Rice's formula and by how large the logic signal is in comparison to the thermal noise voltage. Rice's formula provides a mean frequency of estimated crossings of a threshold in a stationary process with zero effective value, and may be applied to a memory element to determine the bit error rate caused by thermal noise in integrated circuits:

$$BER = \left(\frac{2}{30.5}\right) f_c * t * N_m * e^{\frac{-V_{th}^2}{2*V_n^2}},$$

where BER is the bit error rate, fc is a corner frequency where the thermal noise is comparable to the 1/f noise, t is the time, $N_m$ is the number of memory elements, $V_{th}$ is the noise threshold voltage, and $V_n$ is the effective noise voltage seen on an equivalent resistor in the circuit.

In some embodiments, thermal noise may be reduced using lower operation bandwidths or equivalently a lower computing circuit operations speed, or operation at lower temperatures. These voltages may determine the number of electrons, N, that are stored or need to be stored on a capacitive node in the circuit according to, $N = C_o/q$, where $C_o$ is the capacitance and q is the electric charge.

RTS noise may determine the length of time a signal level can be preserved or saved in electric computing circuits. The noise voltage level may vary as a reciprocal of the frequency over which valid electrical signal levels can be maintained.

Energy efficient computing may be dominated by systems having the lowest noise (both RTS and thermal). This may allow the use of the lowest possible power supply voltages and logic signal levels for most efficient energy computing. In particular, non-volatile logic device with noise near theoretical lower limits may provide energy efficient computing.

FIG. 1A demonstrates a planar n-channel complementary metal-oxide semiconductor (CMOS) field-effect transistor (FET) 100A including a source 102, a drain 106, and a gate 104 on a substrate 110. The CMOS FET 100A further includes a p-type body region 111 with ionized acceptor impurities. An oxide layer 112 may be utilized to insulate the gate 104 from the substrate 110.

Example transistors may include p-type and n-type transistors, and CMOS devices may use complementary and symmetrical pairs of p-type and n-type transistors for logic applications, linear applications, or non-linear applications.

The substrate 110 may be a p-type substrate or include body region 111 with p-type silicon that has positively charged mobile holes as carriers. The drain 106 and source 102 may each be formed (e.g., via diffusion) as regions of n-doped material. The oxide layer 112 may be formed over the substrate 110. The gate 104 may be formed over the oxide layer 112 (e.g., via deposition). Biasing conditions, as described below, can be applied to the various terminals associated with the gate 104, source 102, drain 106, and substrate 110 to selectively enable charge to flow between the source 102 and the drain 106.

A potential 113 may be applied at the gate 104 such that an active conduction channel 115 may be formed in the substrate between the source 102 and the drain 106. The conduction channel 115 is associated with charge carriers accumulated in the substrate region near the oxide layer 112 beneath the gate. The conduction channel may be utilized to promote charge carrier flow (e.g., positive or negative) through the active conduction channel 115 when a potential is applied between the source 102 and the drain 106. The conductivity of the channel may be represented as a function of a potential applied across the gate 104 and the source 102, where the conductivity may be characterized by a threshold voltage that can be determined as a value of the gate-source potential at which conduction begins between the source 102 and the drain 106.

As also illustrated in FIG. 1A, the p-type substrate may include immobile ionized acceptor ions 114, which are negatively charged, in a depletion region. The depletion region may be created in response to a potential 113 applied to the gate 104 relative to the source 102. A bias voltage 108 may be applied across the source 102 to a substrate terminal. The described biasing scheme may be used to dynamically modulate the width $W_d$ of the surface depletion region. For example, an increase in applied bias voltage 108 may increase the width $W_d$ of the depletion region, thereby creating a narrower channel and decreasing charge flow between the source 102 and the drain 106.

Figure 1B:
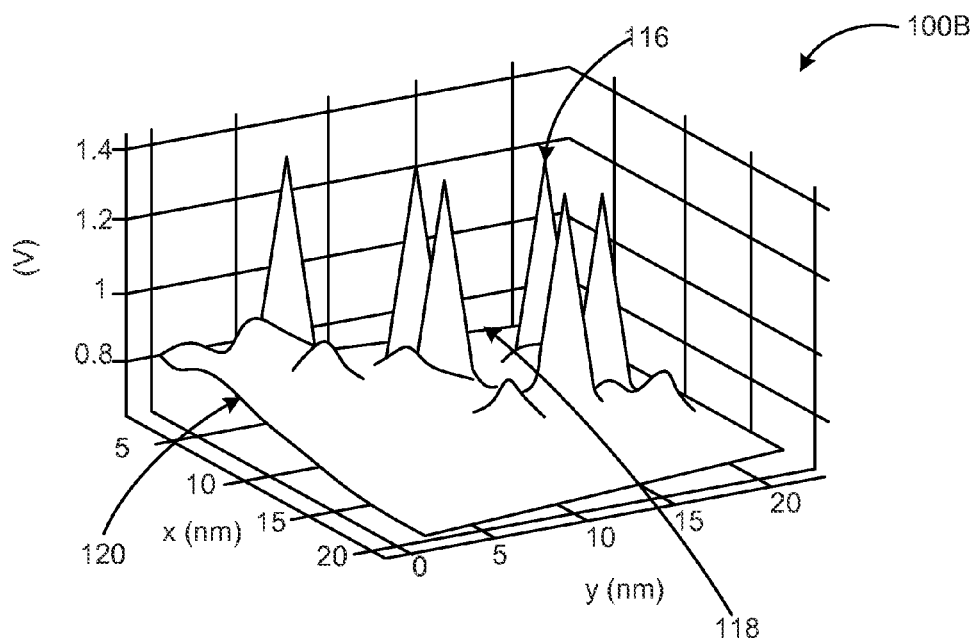

FIG. 1B illustrates a diagram 100B of potential variations at the surface of the substrate 110 as a result of the proximity of ionized acceptor ions close to the surface. Increasing the potential 113 on the gate 104 may lead to a higher electron density in the channel. This higher electron density may result in increased current flow between the source 102 and drain 106, resulting in variations in accumulated charges and charge flow in the channel. Peaks 116 and valleys in potential distribution 120 may result in variations in charge flow as shown in FIG. 1B. This variation may also result in percolation channels 118 for conduction of the drain current, also depicted in FIG. 1B.

In nanoscale transistors, dopant concentration fluctuations may result in unacceptably large variations in the average threshold voltage. For example, if a transistor device with dimensions of about 0.35 micrometers by 0.35 micrometers (e.g., assuming such dimensions in FIG. 1A) has a substrate or well doping concentration of about $10^{17}/cm^3$, there may be about 1000 dopant atoms in the depletion region. If the gate oxide has a thickness of about 66 angstroms or 6.6 nm, then this bulk charge may contribute about 0.3 Volts to the threshold voltage. However, there may be a root mean square fluctuation in the concentration of dopant atoms of about 30 atoms, which may result in variations in the average threshold voltage of about 3% or 10 mV.

Below the mesoscopic size regime (that is, less than about 100 nm), size effects may become important. For technical purposes, the mesoscopic scale may be the size at which the expected fluctuations of the averaged threshold voltage due to location of individual particles can be reduced to below a desirable threshold of a few percent. For dimensions less than about 100 nm, the locations of individual atoms and electric charges become important, and may result in an amplification of random telegraph signal noise. Although the charge due to dopant atoms may be fixed; the charge associated with trapped of electrons may fluctuate with trapping and emission of the electrons in the gate oxide or insulator, thereby modulating the conduction in localized regions of the conduction channel. The degree to which the conduction may be modulated may also depend on the location of dopant atoms in the region adjacent to the electron traps in the oxide layer.

In a system according to disclosed embodiments, a technique to eliminate apparent amplification of random telegraph signal (RTS) noise in nanoscale transistors in logic, linear, and non-linear applications such as processors, amplifiers, limiters, regulators, multipliers, modulators, etc. may facilitate substantial reduction or elimination of the fixed charge behind the conduction channel. Elimination of the fixed charge behind the conduction channel may be accomplished by using fin or pillar-type transistors having a dual gate. A fin-type transistor may be described as a non-planar, double-gate transistor built on a silicon on insulator (SOI) substrate. A distinguishing characteristic of fin type transistors may be that the conducting channel is formed on the sides of a thin silicon "fin," which forms the body of the device. The length of the fin (measured in the direction from source to drain) determines the effective channel length of the device. The pillar type transistor may be described as a 3D transistor including one or more vertical pillars formed on a substrate.

Figure 2:
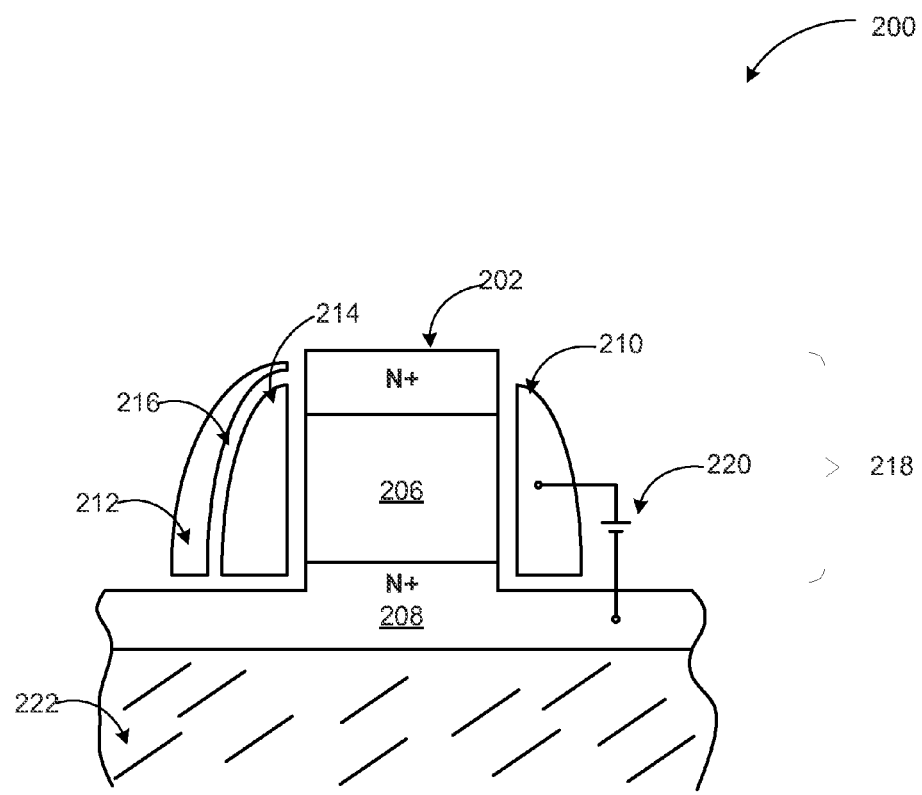
FIG. 2 illustrates an example pillar-type FET with a floating gate.

FIG. 2 illustrates a pillar-type field-effect transistor (FET) with a floating gate, arranged in accordance with some embodiments herein. As illustrated, diagram 200 demonstrates an example embodiment of a pillar-type transistor device 218 including a floating gate 214, and a select gate 210.

The pillar-type transistor device 218 also includes a source 208 over substrate 222 and a drain 202. An inter-gate insulator 216 may be positioned to separate the floating gate 214 from a control gate 212.

In operation, a voltage bias 220 may be applied across the select gate 210 and the source 208. In a system according to embodiments described herein, the pillar-type transistor device 218 may be configured to function in logic, linear, and non-linear applications such as processors, amplifiers, limiters, regulators, multipliers, modulators, etc. The body 206 of the pillar-type transistor device 218 may be substantially depleted of free charge carriers and may also be free of ionized impurities.

Figure 3:
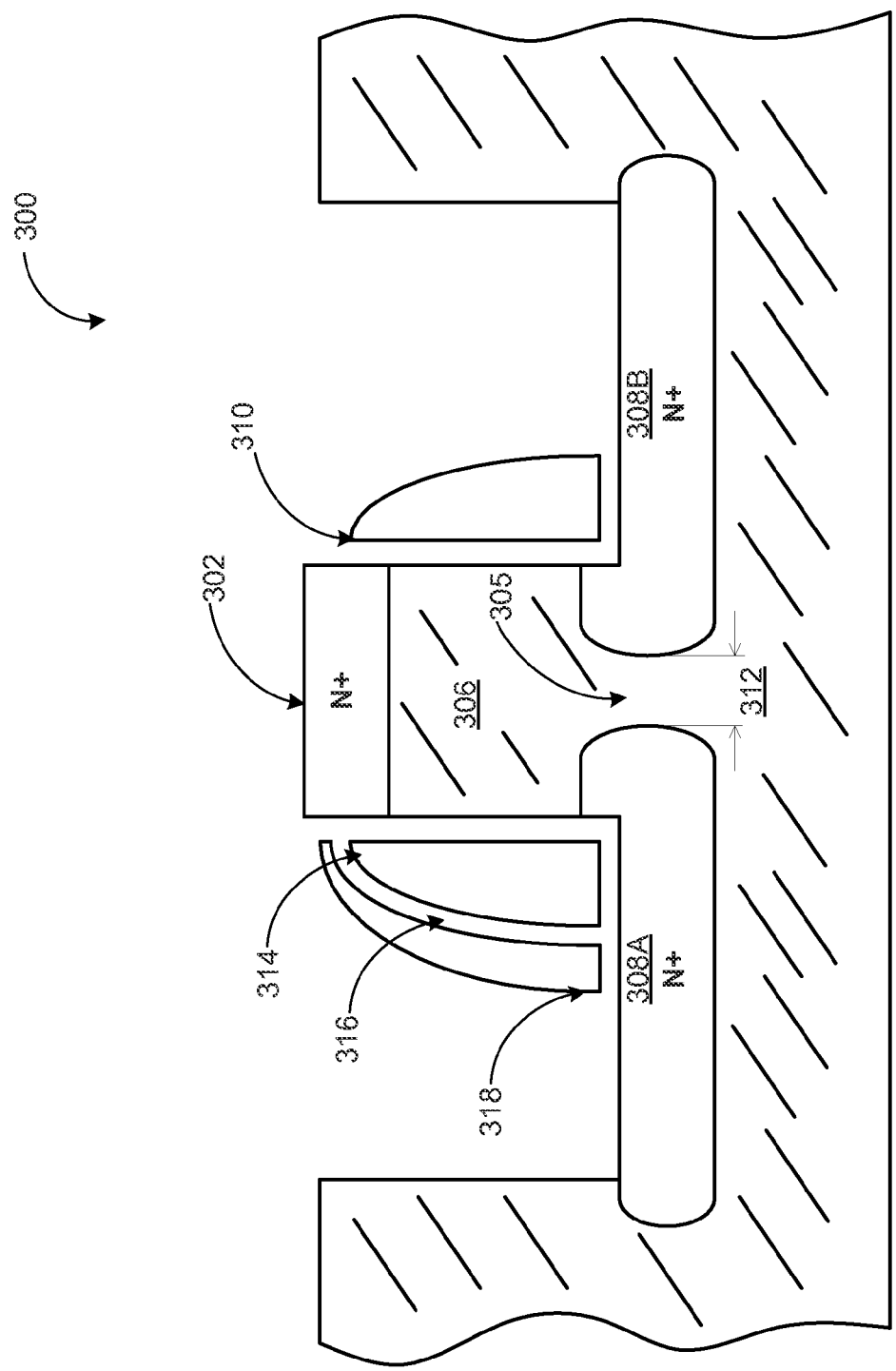
FIG. 3 illustrates another example of a pillar-type FET with a floating gate.

FIG. 3 illustrates another example of a pillar-type field-effect transistor with a floating gate, arranged in accordance with some example embodiments herein. As illustrated by diagram 300, an example pillar-type MOS transistor may include sources 308A and 308B, a select gate 310, a drain 302, a floating gate 314, and a control gate 318. Sources 308A and 308B may be separated by a portion 305 of the substrate 306. In some embodiments, the source region may be arranged as a ring, square, or comparable shape that circles the portion 305 of the substrate 306. The control gate 318 and the floating gate 314 may be separated by an inter-gate insulator 316. Electrons may be stored on or erased from the floating gate 314.

In an example embodiment, a body 306 of a pillar-type MOS transistor may be substantially depleted of free carriers and may also be substantially free of ionized impurities. A junction depth 312, $X_j$, between the two separate sources 308A and 308B parts may also be substantially depleted of free carriers and ions. In the case of a single source structure such as a ring- or square-shaped source the junction depth may be a cross-sectional distance of the junction region.

Figure 4:
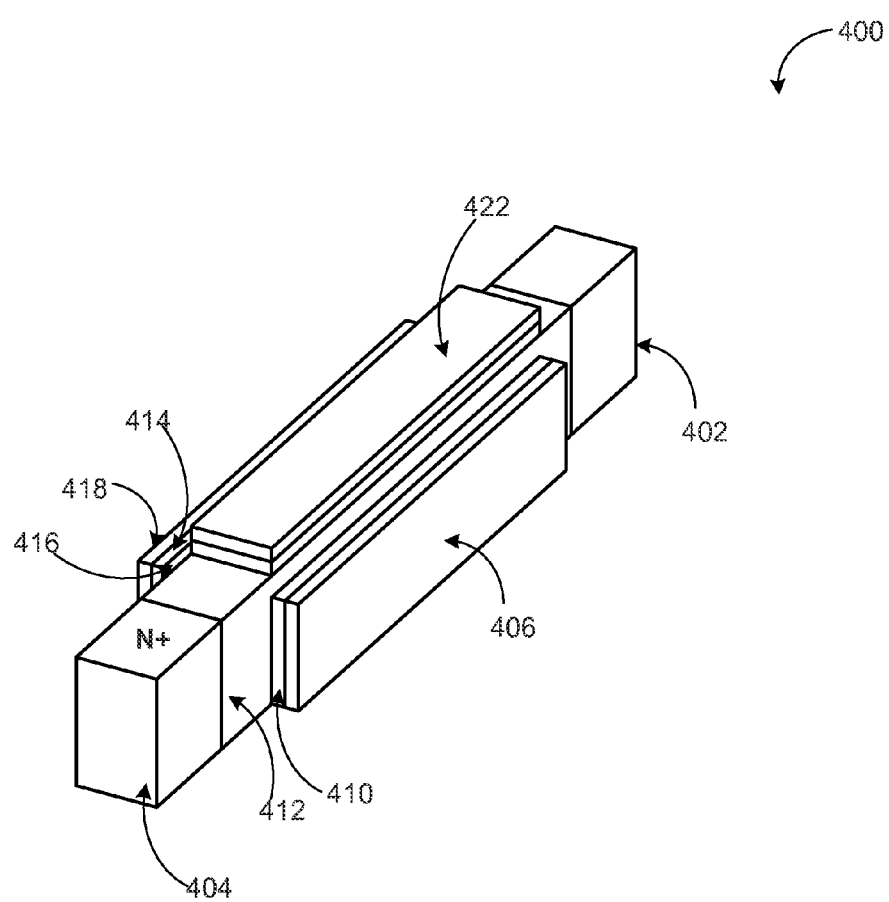
FIG. 4 illustrates an example fin-type FET with a floating gate.

FIG. 4 illustrates a fin-type field-effect transistor (FET) with a floating gate, arranged in accordance with some example embodiments herein. As illustrated in a diagram 400, an example fin-type transistor may include a source 404, a body 412 and a drain 402. The fin-type transistor may also include a floating gate 416 and a control gate 418, separated by an inter-gate insulator 414. In some examples, the fin-type transistor may be configured to function in logic, linear, and non-linear applications such as flash memories, processors, amplifiers, limiters, regulators, multipliers, modulators, etc. Additional gates 422 and 406 may be separated from the body 412 of the transistor by gate insulator(s) 410. In this embodiment, the body 412 of the fin-type transistor may be substantially depleted of free carriers and also substantially free of ionized impurities.

Figure 5:
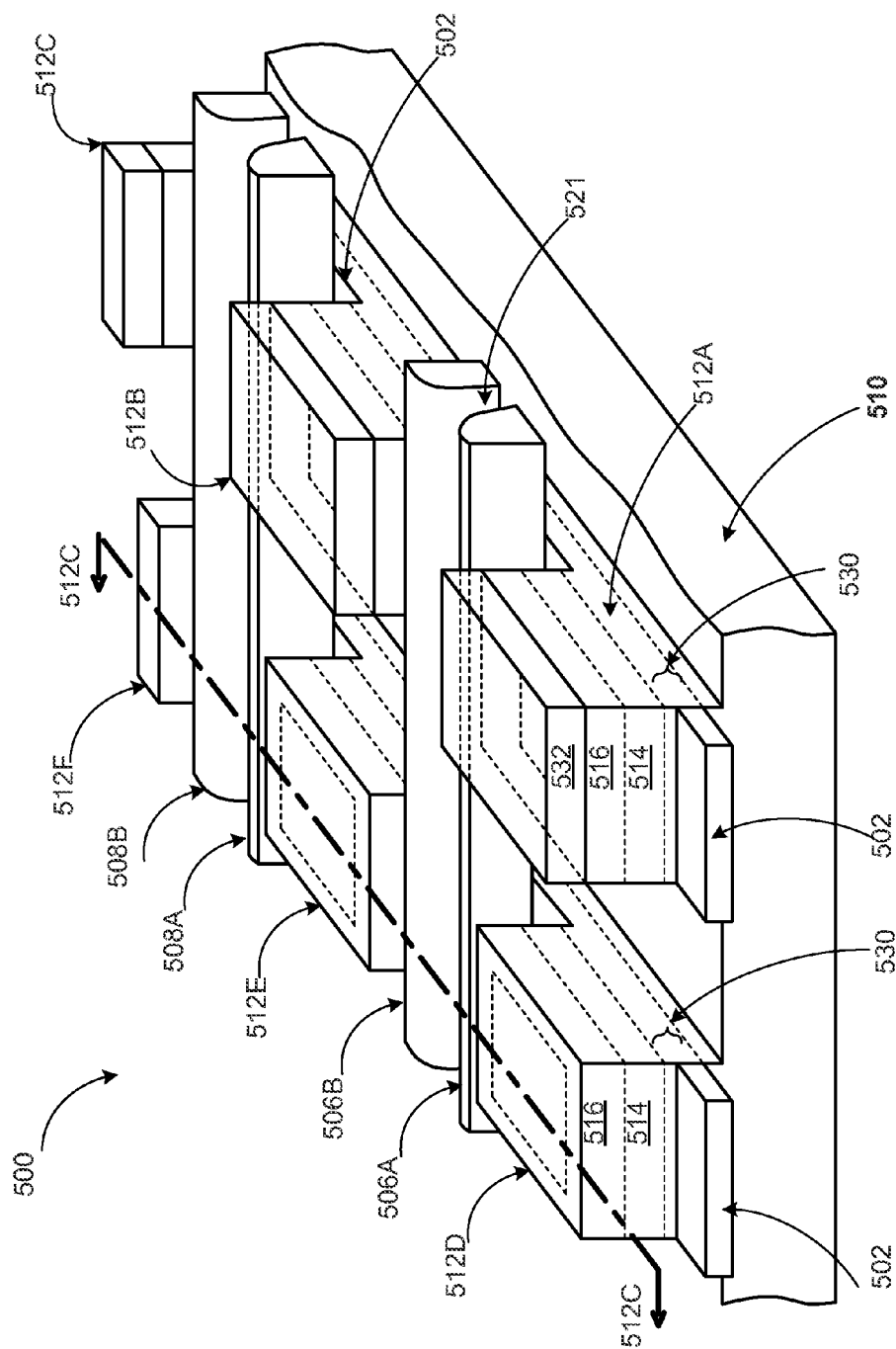
FIG. 5 illustrates example pillar-type FETs in an array.

FIG. 5 illustrates pillar-type transistors arranged in an array, in accordance with some example embodiments herein. As shown in a diagram 500, pillar-type transistors 512A-512F may be arranged in an array on a substrate 510. Each of the pillar-type transistors may include a body 514, a drain 516, drain contact(s) 532, a source 530, and source conductors/connectors 502. The array of pillar-type transistors 512A-512F may also include gate structures 506A, 506B, 508A and 508B, which may be formed in one or more trenches 521. The array of pillar-type transistors may also include floating gates, which are not shown in the diagram 500, but may be located under at least one of the gate structures 506A, 506B, 508A and 508B. The floating gates may be separated from the gate structures 506A, 506B, 508A and 508B by insulating layers, and may also be separated from the each of the pillar-type transistors by gate insulator layers. The gate structures 506A and 508A may serve as control gates, and the gate structures 506B and 508B may serve as select gates. Any pillar-type transistor in the array may be operated by selecting an appropriate source conductor/connector 502 and selecting an appropriate select gate. Electrical connections between the drain contacts 532 may be provided of at least one of the pillar-type transistors in order to allow array type operation between each of the pillar-type transistors 512A-512F. The cross section along 512C shows pillar type devices such as the device demonstrated in FIG. 2. In a system arranged according to various disclosed embodiments, a body 514 of each of the pillar-type transistors may be substantially depleted of free carriers and also substantially free of ionized impurities.

Figure 6:
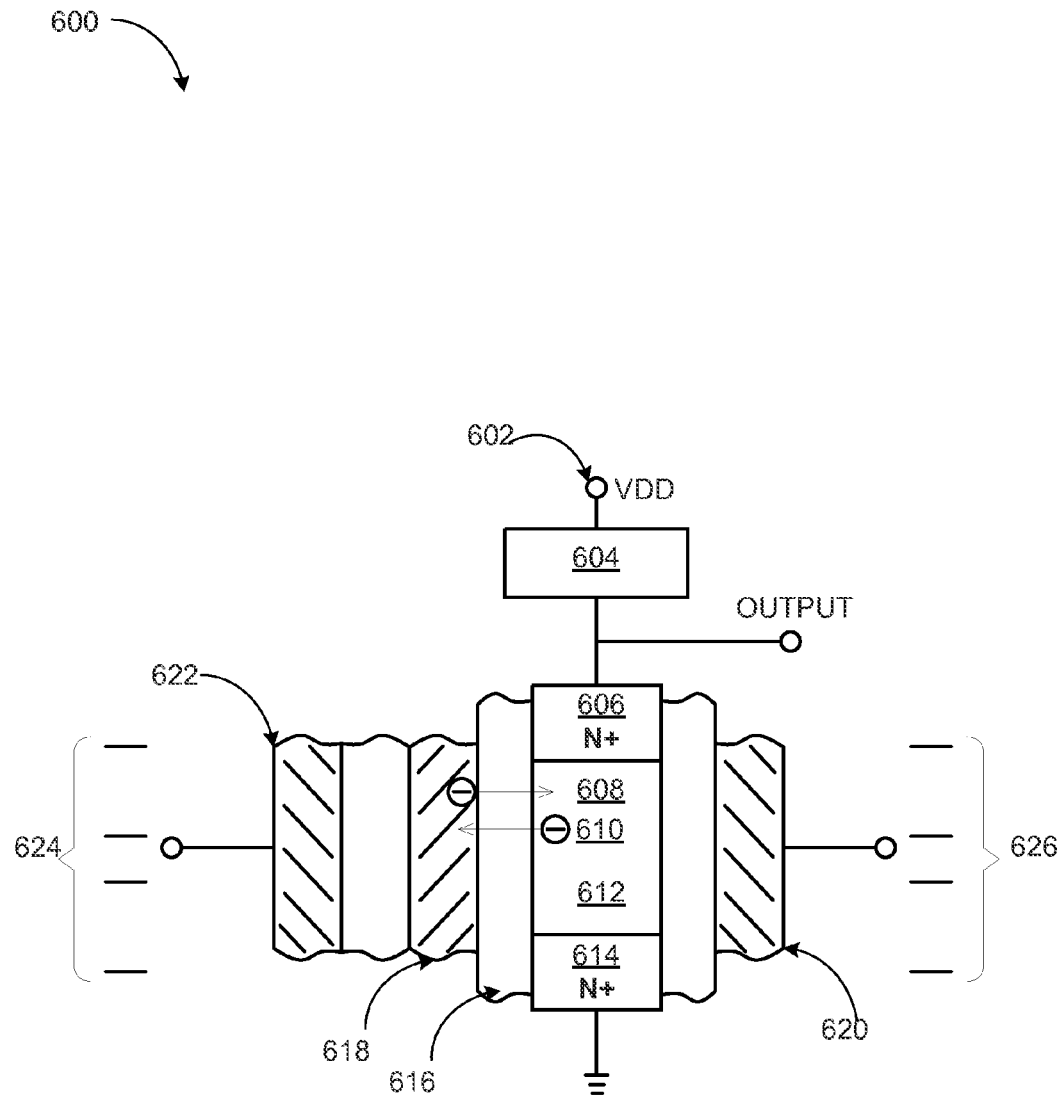
FIG. 6 illustrates an electrical circuit operation of a device that includes a non-volatile random access memory device that is configured for energy efficient operation.

FIG. 6 illustrates an electrical circuit operation of a device that includes a non-volatile random access memory device that is configured for energy efficient operation, arranged in accordance with at least some embodiments herein.

The transistor device 600 may include a body 612, a drain 606, and a source 614, and be configured for low power operation as non-volatile random access memory element, for example. The transistor device 600 may further include a select gate 620, a control gate 622 and a floating gate 618, separated by an insulator layer. A power supply voltage $V_{DD}$ 602 may be coupled through a load 604 to the drain 606. The power supply voltage $V_{DD}$ 602 and the load 604 may together determine a power dissipation associated with the transistor device 600. The transistor device 600 may be implemented as a dual-gated structure where the first gate may be a conventional non-volatile flash memory control gate 622 that is coupled to the floating gate 618 and where the second gate may be the select gate 620. An insulating gate oxide layer 616 may separate the dual gates (618, 620) from the body 612 as previously described herein.

In an example embodiment, at least four different potential levels 626 may be applied to the select gate 620 during operation. The potential levels 626 may be selected based on a desired operation for the transistor device, such as a charging operation, a discharging operation, or a selection operation. If the select gate 620 is operated at an intermediate negative voltage, then the control gate 622 may be disabled and thus unable to turn the transistor device on at an operating voltage. Thus, the transistor device 600 may not conduct, and may be in an off-state or not selected state. When the select gate 620 is operated at an intermediate positive voltage, then the control gate 622 is enabled and thus may be operated to turn the transistor device 600 on if there is no charge stored on the floating gate 618. If charge is stored on the floating gate 618, the transistor device may remain in the off-state even though selected. A most positive potential on the select gate 620 may facilitate the removal 608 of charges stored on the floating gate 618, whereas a most negative potential on the select gate 620 may be used to assist the control gate 622 in the addition 610 of electrons onto the floating gate 618. The control gate 622 may likewise have a number of different potential levels 624 associated with the operation of a non-volatile random access memory.

In a system arranged according to embodiments described herein, a conduction channel of the transistor device 600 may be substantially depleted of charge carriers when the transistor device has no bulk charge or ionized impurities in the body 612 adjacent to the conduction channel of the control gate 622. As a result, the transistor device 600 may have substantially no consequential potential variations at the conduction surface, no percolation channels, and no apparent multiplication of trapped charge in an insulating gate oxide layer 616 of the transistor device or apparent amplification of charge trapped on the floating gate 618.

The emission of an electron from the gate oxide, which results in RTS noise, can be described by a formula for a planar sheet of conduction in the transistor device. This electron emission may result in a change in the drain current, $\Delta I_{dsn}$. The formula for change in drain current, $\Delta I_{dsn}$, may be represented as follows:

$$\Delta I_{dsn} = (\mu C_o)(W/L)(V_{gs} - V_t)\Delta V_t,$$

where $\Delta V_t = q/C_o$, $C_o$ is the gate capacitance, q is the electric charge, μ is the electron mobility, W/L is the width W to length L ratio of the transistor, $V_{gs}$ is the gate to source voltage, and $V_t$ is the threshold voltage of the transistor. This change in drain current ($\Delta I_{dsn}$) may represent a minimal RTS noise signal of the transistor device. There may be, however, a probability that more than one trapped electron may be emitted from the gate insulating oxide during the duration of the first RTS signal, which may result in a larger noise signal of RTS signals. In a system arranged according to various embodiments described herein, the logic signal should be maintained at a higher signal level than this complex RTS signal to ensure that the logic signal is valid (i.e., the logic signal should exceed the noise).

Figure 7:
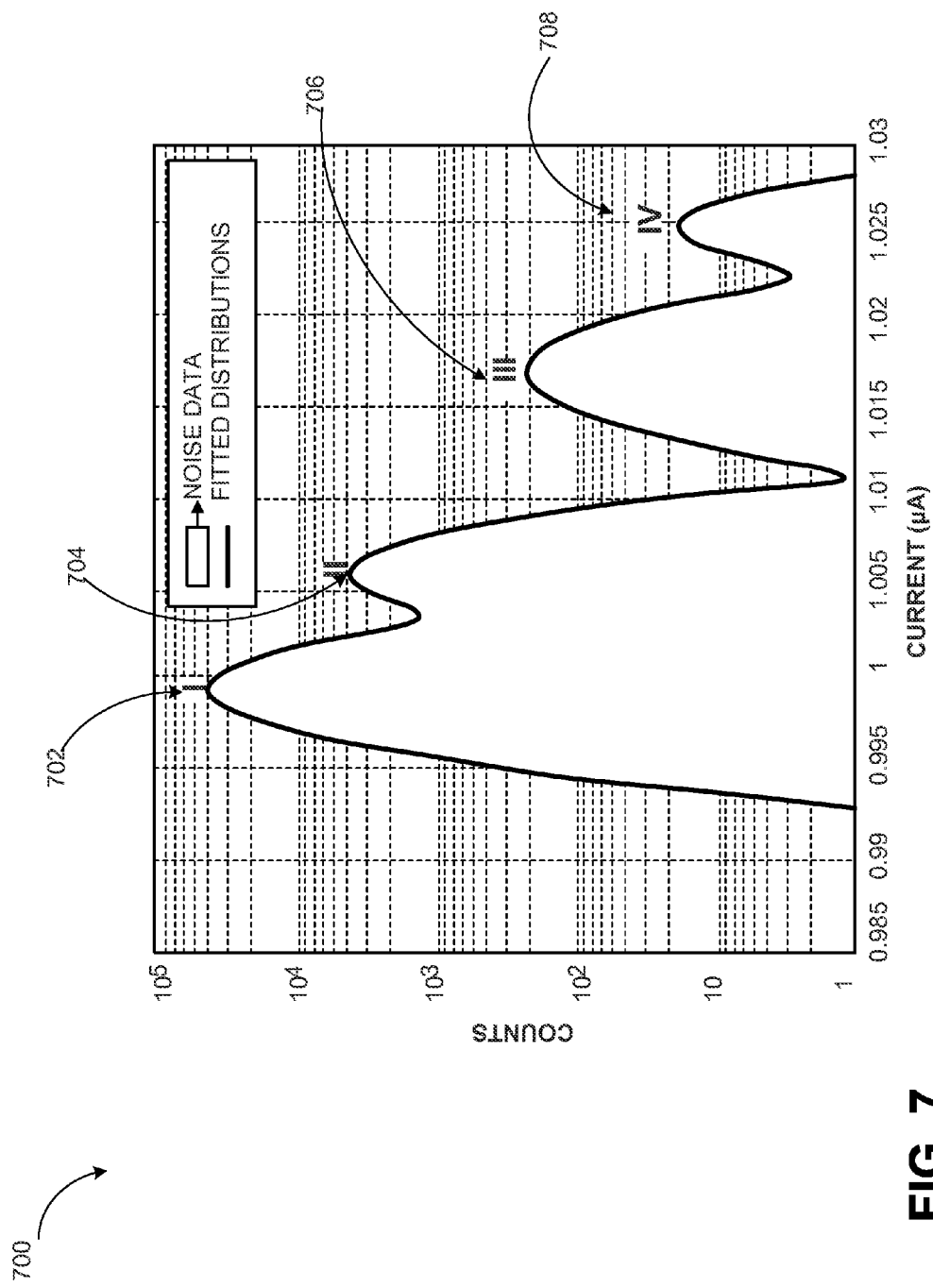
FIG. 7 illustrates example histograms of RTS noise signals associated with emissions of single electrons.

FIG. 7 illustrates histograms of RTS noise signals associated with emissions of single electrons, arranged in accordance with at least some embodiments herein. As demonstrated in a diagram 700, a histogram of recorded signal of MOS transistor drain noise shows two traps seen as four peaks (peaks 702, 704, 706, 708). Peaks 702 and 706 may be considered one trap and peaks 704 and 708 may be considered a second trap. The histogram may be based on a generated model for RTS signals where trapped electrons modulate conduction in the transistor channels. The resulting multimodal Gaussian distribution as shown in the histogram may describe the Gumbel cumulative probability distribution.

Modulation of the conduction in the transistor channels by trapped electrons may impact a performance of an application of the transistor such as bit error rate (BER) in memory or processor applications. In an example embodiment, the BER due to RTS noise may be approximately represented as:

$$BER \approx v^* t^* \exp(-N_s^2/N_{rts}^2)$$

where v is the frequency of escape of electrons from the oxide trap, t is the elapsed time, $N_s$ is the number of electrons associated with the logic signal and $N_{rts}$ is the root mean square value of the number of electrons associated with the RTS or 1/f noise.

If the computing frequency, f, is high (e.g., in the hundreds of MHz or higher), then there may be a large amount of thermal noise and a large number of electrons associated with the thermal voltage, $V_n$. This may approach the number of electrons associated with the noise threshold voltage $V_{th}$, increasing the average BER over a particular time period. If the time period (t) required for retention of data is long, then the number of electrons associated with RTS noise may become larger as time period, t, increases. As the number of electrons associated with RTS noise approaches the number of electrons associated with the signal logic level, the average BER may increase.

There may be a substantially optimal frequency (f) for energy efficient and low power operation, which may correspond to a frequency around the 1/f noise corner frequency where the 1/f noise or RTS noise is comparable to the thermal noise. Above this approximately optimal frequency, the thermal noise may increase with increased frequency, and below this frequency the RTS noise may increase due to the requirement for longer retention times. In modern MOS transistors this frequency may be around 100 MHz or time periods of fractional microseconds.

Figure 8:
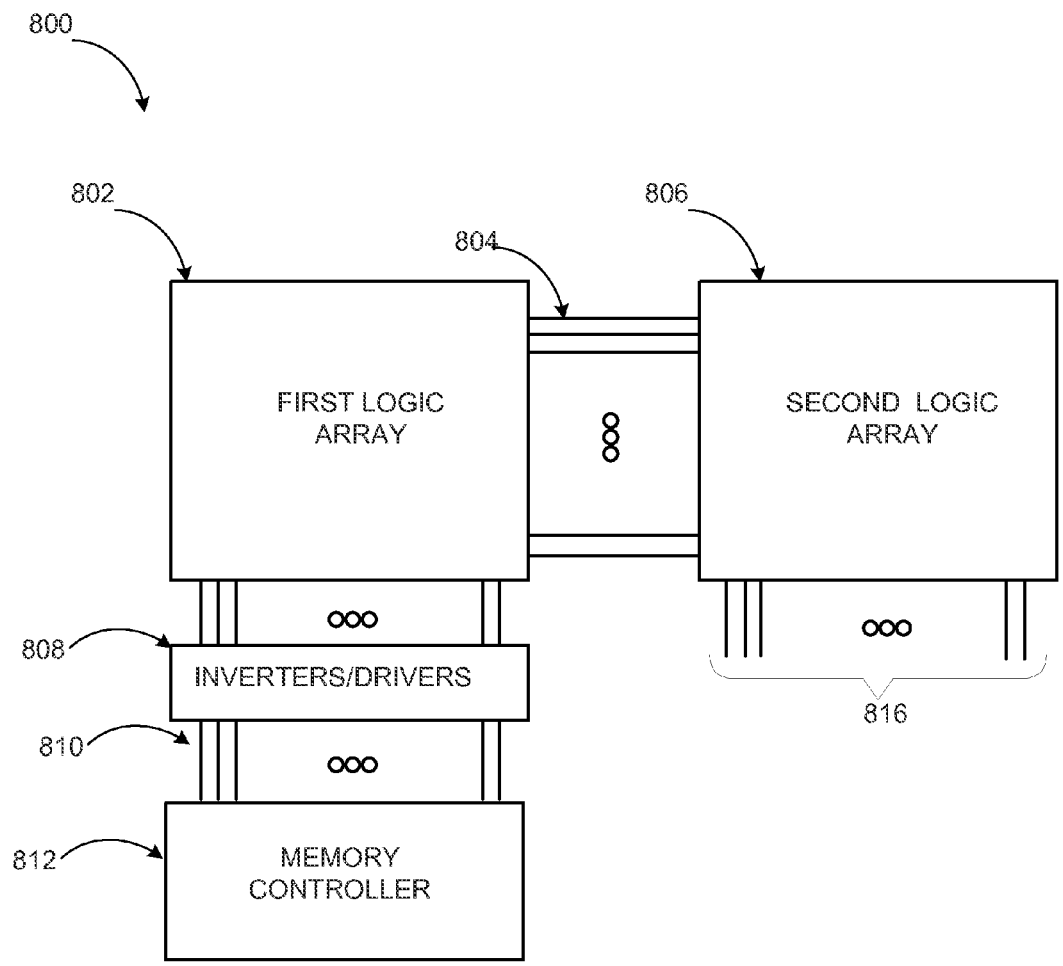
FIG. 8 illustrates example programmable logic array applications of non-volatile memory.

FIG. 8 illustrates programmable logic array (PLA) applications of non-volatile memory, arranged in accordance with at least some embodiments herein. As demonstrated in FIG. 8, a complex two level logic function 800 can be realized by two logic arrays shown here as 802 and 806. Logic array 802 may include a set of outputs that may be couple to inputs of logic array 806 either by direct coupling 804, or through other intermediate couplings such as through additional buffers, drivers, inverters, or other logic (not shown). Inputs 810 to the first logic array 802 may be either directly coupled to the logic array 802, or the inputs 810 may be coupled to the inputs of the first logic array 802 via other logic, buffers, drivers or inverters as illustrated by drivers 808. The second logic array 806 may also include outputs 816.

In some embodiments, one or more of the logic arrays 802/806 may include nonvolatile memory cells that are configured as described above. A memory controller 812 or logic array module may be configured to facilitate one or more memory operations on the nonvolatile memory cells, such as a read operation, a write operation, or an erase operation, be selective use of the control and select gates of the nonvolatile memory cells.

Figure 9:
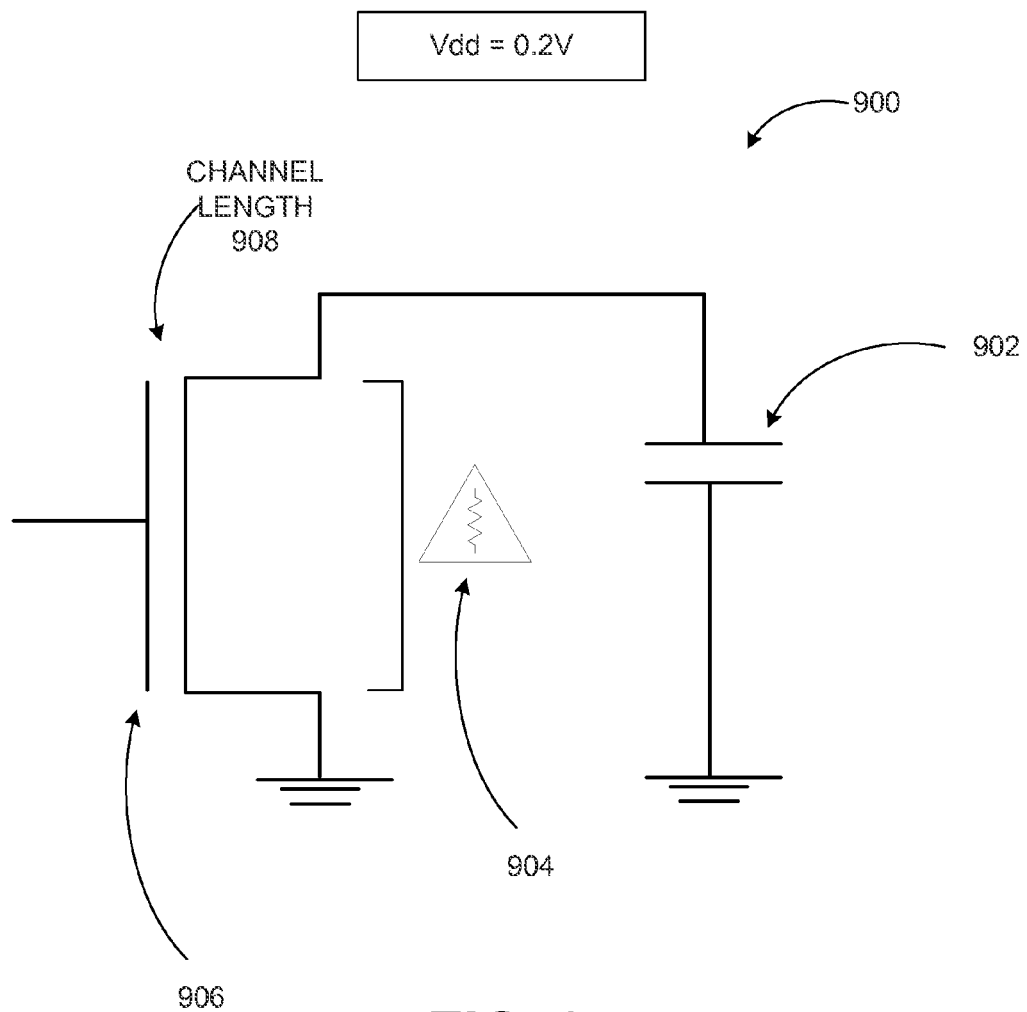
FIG. 9 illustrates an example operation of a dynamic memory cell.

FIG. 9 illustrates operation of a memory cell, arranged in accordance with at least some embodiments herein. In some example systems, there may be an approximately optimal frequency of operation that facilitates reduced energy consumption, where the frequency of operation is near the 1/f noise corner frequency or the frequency at which the 1/f noise is reduced to a value comparable to the thermal noise.

An example dynamic memory cell as demonstrated in diagram 900 may represent a one gigabyte memory device. For example, an example one gigabyte memory device may have a frequency of operation of fc=100 MHz, and BER=1 per year, where one year is roughly equivalent to ten million seconds. The described BER may be characterized as:

$$BER = \left(\frac{2}{3}\right)^{0.5} f_c * t * N_m * e^{\frac{-V_{th}^2}{2*V_n^2}},$$

from which following approximations may be deduced:

$\exp(V_{th}^2/(2V_n^2)) \approx (10^8 10^2 10^9)$, $V_{th}^2/(2V_n^2) \approx 77$, and $V_{th} \approx 12 V_n$.

In the memory device of diagram 900, an example node capacitance 902 may correspond to 1.0 fF, which may correspond to a transistor with gate 906, where charge is stored. Area dimensions of the gate 906 may be 40 nm×40 nm. In order to remove this charge on a 1.0 fF node in a time period of 1/100 MHz or 10 nanoseconds may involve an RC time constant of the order of 10 nanoseconds or an equivalent resistance 904 of $10^7$ ohms. The root mean square thermal noise voltage across the equivalent resistance 904 may then be 4 mV with a 100 MHz operating frequency. The noise threshold voltage ($V_{th}$) may correspond to approximately 12 $V_n$ or approximately 50 mV or 0.05 V. This may then allow operation with a 0.2V power supply. The energy stored on the gate of the transistor may then be determined approximately as $(\frac{1}{2})*C_s*V_2$ or 0.02 fJ, and the charge stored may then correspond to about 1000 electrons.

In one practical example, a change in charge on a floating gate of 60 electrons may be required to activate a transistor with a 1 nm insulator gate oxide, a gate capacitance of 0.05 fF and an excess of gate voltage in near threshold computing of 0.2 V. If memory elements of a device (e.g., memory array) incorporating this transistor are refreshed every millisecond, this may result in a power dissipation of 0.02 mW or a very low power dissipation in comparison to conventional dynamic random access memories.

In some example systems described herein, the logic level of computing devices may be determined by a minimal number of electrons that is established by the specified BER. The minimal voltage levels, and as a consequence, minimal power dissipation may be determined by fundamental noise sources in electronic circuits, including thermal and RTS (1/f) noise. Low power operation may be achieved by operating frequencies near those operating frequencies resulting in efficient utilization of energy and minimal power dissipation. In some embodiments the number of electrons stored on the floating gate of a nonvolatile memory cell that correspond to a high logic level may be adjusted by, for example, adjusting the power supply voltage provided to the memory cell and/or adjusting the logic signal level(s) provided to the memory cell (for example, the level of signals provided to the control gate). Logic signal levels may either be supplied referenced, ground referenced, or fully differential. Single ended signals may only require one signal to be coupled to the device as a control signal, because they are either referenced to a supply level or to ground as the return to the single-ended signal. Differential signals are applied differentially as a pair of signals that have no ground reference directly. These are the kinds of signals that may often be used in high speed systems.

Figure 10:
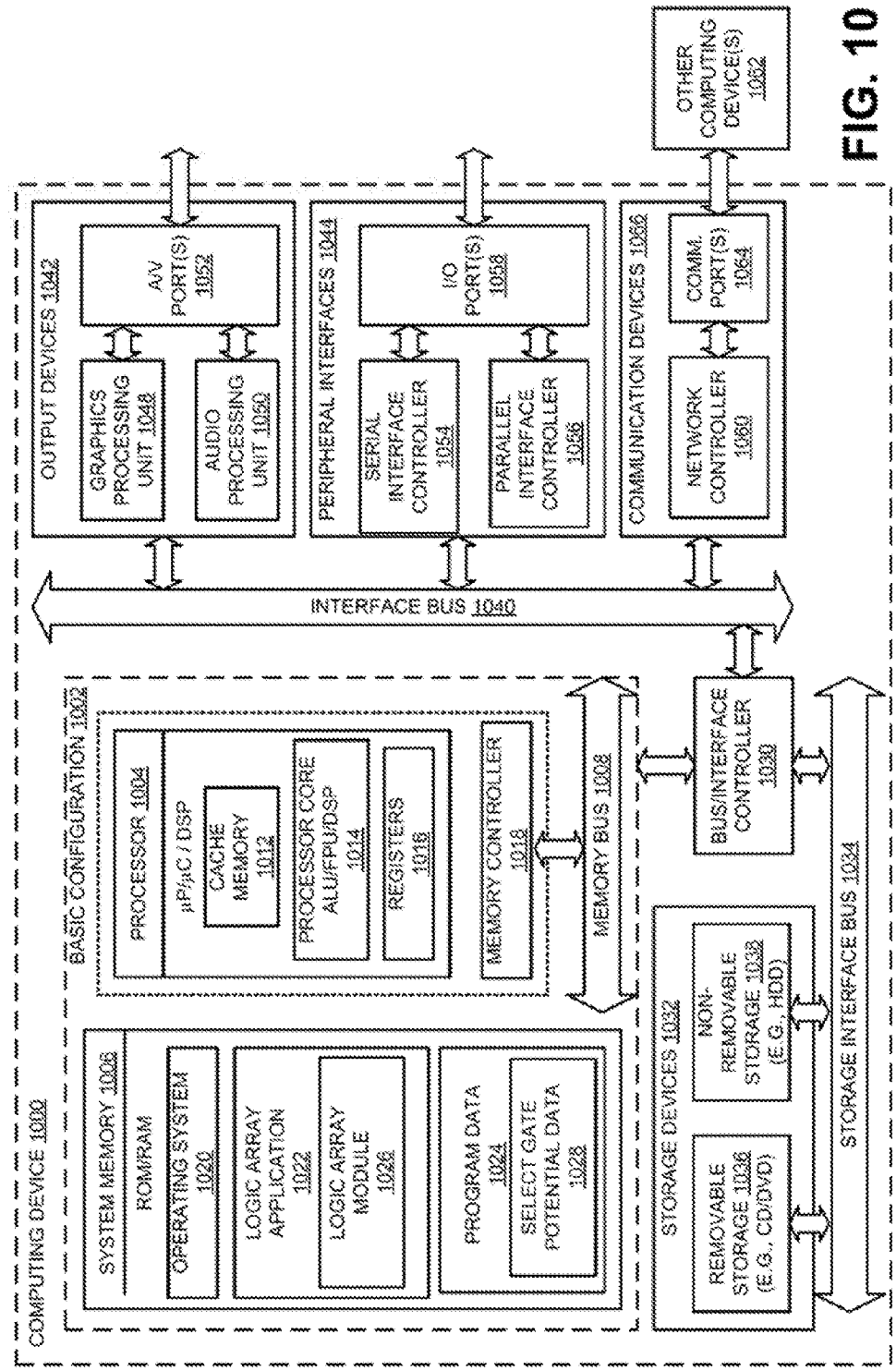
FIG. 10 illustrates a general purpose computing device, which may be used to implement energy efficient computing by accounting for single electrons in non-volatile random access flash memories.

FIG. 10 illustrates a general purpose computing device, which may be configured to provide energy efficient computing by accounting for single electrons in non-volatile random access flash memories, arranged in accordance with at least some embodiments as described herein.

For example, the computing device 1000 may be used as a server, desktop computer, portable computer, smart phone, special purpose computer, or similar device. In an example basic configuration 1002, the computing device 1000 may include one or more processors 1004 and a system memory 1006. A memory bus 1008 may be used for communicating between the processor 1004 and the system memory 1006. The basic configuration 1002 is illustrated in FIG. 10 by those components within the inner dashed line.

Depending on the desired configuration, the processor 1004 may be of any type, including but not limited to a microprocessor (μP), a microcontroller (μC), a digital signal processor (DSP), or any combination thereof. The processor 1004 may include one more levels of caching, such as a cache memory 1012, one or more processor cores 1014, and registers 1016. The example processor cores 1014 may (each) include an arithmetic logic unit (ALU), a floating point unit (FPU), a digital signal processing core (DSP Core), or any combination thereof. An example memory controller 1018 may also be used with the processor 1004, or in some implementations the memory controller 1018 may be an internal part of the processor 1004.

Depending on the desired configuration, the system memory 1006 may be of any type including but not limited to volatile memory (such as RAM), non-volatile memory (such as ROM, flash memory, etc.) or any combination thereof. The system memory 1006 may include an operating system 1020, one or more logic array applications 1022, and program data 1024. The logic array applications 1022 may include one or more logic array modules 1026, which may be an integral part of the logic array application 1022 or a separate application on its own. The logic array modules 1026 may be configured to facilitate adjustment of low-power nonvolatile memory cells configured with select gates as described herein. The program data 1024 may include, among other data, select gate potential data 1028 or the like, as described herein. Low-power, non-volatile memory cells with select gates as described herein may be used to implement various memories within the computing device 1000 such as the system memory 1006, but also memories internal to the processor 1004 or other parts such as GPU 1048, or even memory devices external to the computing device 1000.

The computing device 1000 may have additional features or functionality, and additional interfaces to facilitate communications between the basic configuration 1002 and any desired devices and interfaces. For example, a bus/interface controller 1030 may be used to facilitate communications between the basic configuration 1002 and one or more data storage devices 1032 via a storage interface bus 1034. The data storage devices 1032 may be one or more removable storage devices 1036, one or more non-removable storage devices 1038, or a combination thereof. Examples of the removable storage and the non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media may include volatile and nonvolatile, removable and non-removable media implemented in any method or technology for storage of information, such as computer readable instructions, data structures, program modules, or other data.

The system memory 1006, the removable storage devices 1036 and the non-removable storage devices 1038 are examples of computer storage media. Computer storage media includes, but is not limited to, RAM, ROM, EEPROM, flash memory or other memory technology, CD-ROM, digital versatile disks (DVD), solid state drives, or other optical storage, magnetic cassettes, magnetic tape, magnetic disk storage or other magnetic storage devices, or any other medium which may be used to store the desired information and which may be accessed by the computing device 1000. Any such computer storage media may be part of the computing device 1000.

The computing device 1000 may also include an interface bus 1040 for facilitating communication from various interface devices (for example, one or more output devices 1042, one or more peripheral interfaces 1044, and one or more communication devices 1066) to the basic configuration 1002 via the bus/interface controller 1030. Some of the example output devices 1042 include a graphics processing unit 1048 and an audio processing unit 1050, which may be configured to communicate to various external devices such as a display or speakers via one or more A/V ports 1052. One or more example peripheral interfaces 1044 may include a serial interface controller 1054 or a parallel interface controller 1056, which may be configured to communicate with external devices such as input devices (for example, keyboard, mouse, pen, voice input device, touch input device, etc.) or other peripheral devices (for example, printer, scanner, etc.) via one or more I/O ports 1058. An example communication device 1066 includes a network controller 1060, which may be arranged to facilitate communications with one or more other computing devices 1062 over a network communication link via one or more communication ports 1064. The one or more other computing devices 1062 may include servers, client devices, smart appliances, and comparable devices.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

The computing device 1000 may be implemented as a part of a general purpose or specialized server, mainframe, or similar computer that includes any of the above functions. The computing device 1000 may also be implemented as a personal computer including both laptop computer and non-laptop computer configurations.

Example embodiments may also include methods. These methods can be implemented in any number of ways, including the structures described herein. One such way may be by machine operations, of devices of the type described in the present disclosure. Another optional way may be for one or more of the individual operations of the methods to be performed in conjunction with one or more human operators performing some of the operations while other operations may be performed by machines. These human operators need not be collocated with each other, but each can be only with a machine that performs a portion of the program. In other embodiments, the human interaction can be automated such as by pre-selected criteria that may be machine automated.

Figure 11:
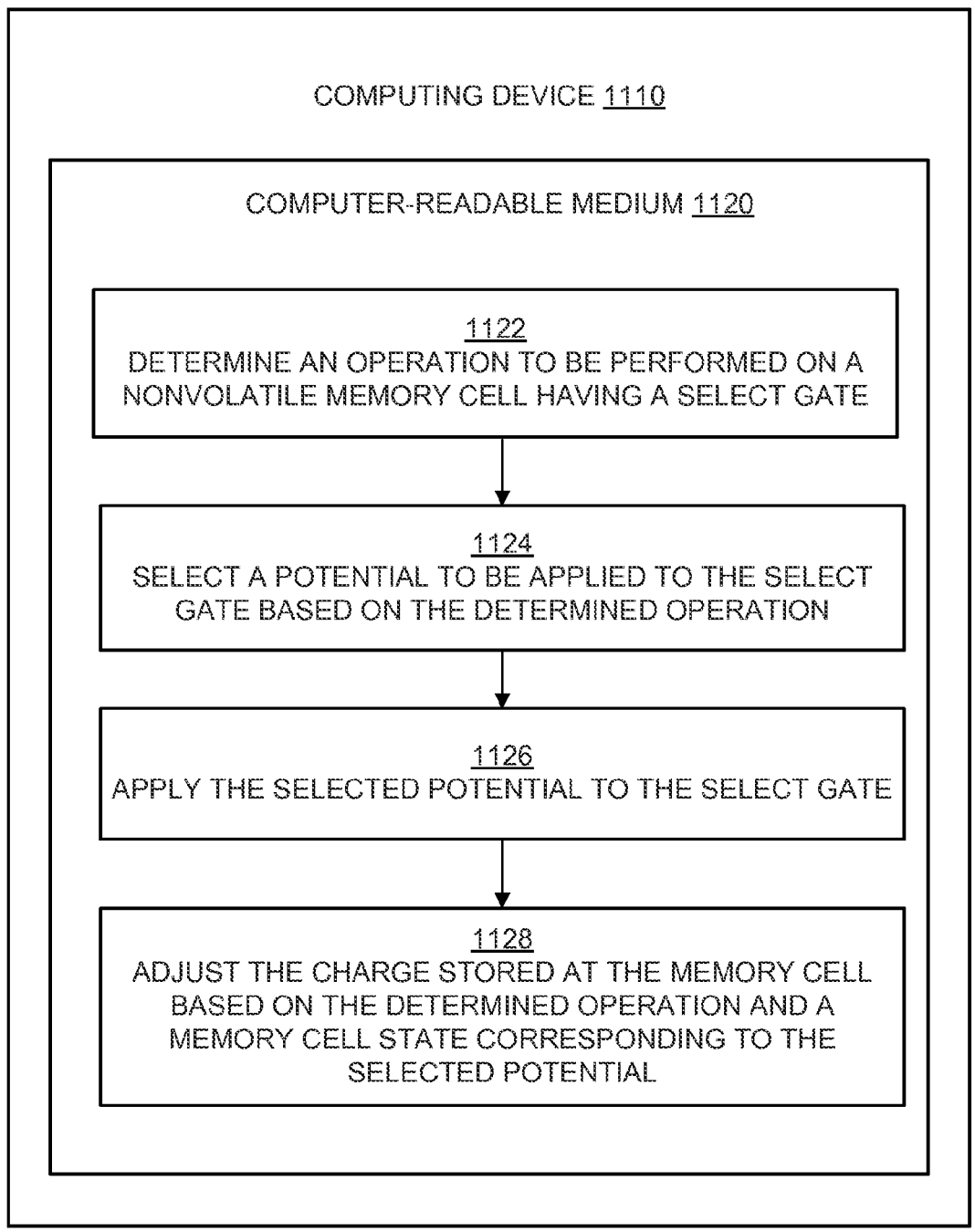
FIG. 11 is a flow diagram illustrating an example method that may be performed by a computing device such as the computing device in FIG. 6.

FIG. 11 is a flow diagram illustrating an example method that may be performed by a computing device such as the computing device in FIG. 10, arranged in accordance with at least some embodiments as described herein. Example methods may include one or more operations, functions or actions as illustrated by one or more of blocks 1122, 1124, 1126, and 1128. The operations described in the blocks 1122 through 1128 may also be stored as computer-executable instructions in a computer-readable medium such as a computer-readable medium 1120 of a computing device 1110.

An example process for providing energy efficient computing by accounting for single electrons in non-volatile random access flash memories may begin with block 1122, "DETERMINE AN OPERATION TO BE PERFORMED ON A NONVOLATILE MEMORY CELL HAVING A SELECT GATE", where a memory controller or a logic array module may be configured to determine an operation (for example, a charge, discharge, or select) to be performed on a nonvolatile memory cell having a select gate as described above. In some embodiments, the operation may be based on a desired memory operation, such as a read, write, or erase operation, to be performed on a memory portion including the nonvolatile memory cell.

Block 1122 may be followed by block 1124, "SELECT A POTENTIAL TO BE APPLIED TO THE SELECT GATE BASED ON THE DETERMINED OPERATION", where the memory controller or logic array module may be configured to select an appropriate potential to be applied to the select gate of the memory cell based on the determined operation. For example, when the determined operation is a charge operation, an appropriate potential might be a negative potential corresponding to a transistor body state to facilitate an increase of the number of electrons stored on the floating gate of the memory cell. Alternatively, differentially applied signals may also be used.

Block 1124 may be followed by block 1126, "APPLY THE SELECTED POTENTIAL TO THE SELECT GATE", where the memory controller or logic array module may apply the potential selected in block 1124 to the select gate of the nonvolatile memory cell. For example, the memory controller or logic array module may be configured to apply a single-ended signal having the selected potential to the select gate.

Block 1126 may be followed by block 1128, "ADJUST THE CHARGE STORED AT THE MEMORY CELL BASED ON THE DETERMINED OPERATION AND A MEMORY CELL STATE CORRESPONDING TO THE SELECTED POTENTIAL", where the memory controller or logic array module may be configured to adjust the charge stored on the floating gate of the memory cell based on the determined operation and the memory cell state corresponding to the potential applied to the select gate. For example, when the determined operation is a charge operation, the memory controller or logic array module may be configured to apply a signal to the control gate associated with the floating gate of the memory cell to add electrons to the floating gate.

The blocks included in the above described process are for illustration purposes. Adjustment of low-power nonvolatile memory cells configured with select gates may be implemented by similar processes with fewer or additional blocks. In some embodiments, the blocks may be performed in a different order. In some other embodiments, various blocks may be eliminated. In still other embodiments, various blocks may be divided into additional blocks, or combined together into fewer blocks.

FIG. 12 illustrates a block diagram of an example computer program product, arranged in accordance with at least some embodiments as described herein.

In some embodiments, as shown in FIG. 12, the computer program product 1200 may include a signal bearing medium 1202 that may also include one or more machine readable instructions 1204 that, when executed by, for example, a processor may provide the functionality described herein. Thus, for example, referring to the processor 1004 in FIG. 10, a logic array module 1026 executed on the processor 1004 may undertake one or more of the tasks shown in FIG. 12 in response to the instructions 1204 conveyed to the processor 1004 by the signal bearing medium 1202 to perform actions associated with providing energy efficient computing by accounting for single electrons in non-volatile random access flash memories as described herein. Some of those instructions may include, for example, instructions to determine an operation to be performed on a nonvolatile memory cell having a select gate, select a potential to be applied to the select gate based on the determined operation, apply the selected potential to the select gate, and/or adjust the charge stored at the memory cell based on the determined operation and a memory cell state corresponding to the selected potential, according to some embodiments described herein.

In some implementations, the signal bearing medium 1202 depicted in FIG. 12 may encompass a computer-readable medium 1206, such as, but not limited to, a hard disk drive, a solid state drive, a Compact Disc (CD), a Digital Versatile Disk (DVD), a digital tape, memory, etc. In some implementations, the signal bearing medium 1202 may encompass a recordable medium 1208, such as, but not limited to, memory, read/write (R/W) CDs, R/W DVDs, etc. In some implementations, the signal bearing medium 1202 may encompass a communications medium 1210, such as, but not limited to, a digital and/or an analog communication medium (for example, a fiber optic cable, a waveguide, a wired communications link, a wireless communication link, etc.). Thus, for example, the computer program product 1200 may be conveyed to one or more modules of the processor 1004 of FIG. 10 by an RF signal bearing medium, where the signal bearing medium 1202 is conveyed by the wireless communications medium 1210 (for example, a wireless communications medium conforming with the IEEE 802.11 standard).

According to some examples, methods to adjust a nonvolatile memory cell having a transistor body, a select gate coupled to the body, a floating gate coupled to the body, and a control gate coupled to the floating gate are described. Example methods may include determining an operation to be performed on the memory cell; selecting a potential from a plurality of potentials based on the determined operation to be performed, where each potential in the plurality of potentials corresponds to a respective body state of the transistor body; and applying the selected potential to the select gate. Example methods may also include adjusting a number of electrons stored on the floating gate responsive to the control gate based on the determined operation and the body state that corresponds to the selected potential applied to the select gate.

According to other examples, determining the operation to be performed may include determining the operation as one of a charging operation, a discharging operation, or a cell selection operation. Selecting the potential from the plurality of potentials may include selecting a first positive potential that corresponds to a first body state, where the number of electrons stored on the floating gate determines whether the control gate is able to turn the memory cell on and off; or selecting a first negative potential that corresponds to a second body state where the control gate is unable to turn the memory cell on.

According to further examples, selecting the potential from the plurality of potentials may further include selecting a second positive potential greater than the first positive potential and that corresponds to a third body state, where reduction of the number of electrons stored on the floating gate is facilitated; or selecting a second negative potential greater than the first negative potential and that corresponds to a fourth body state, where increase of the number of electrons stored on the floating gate is facilitated. Adjusting the number of electrons stored on the floating gate responsive to the control gate may include storing a high logic level on the floating gate. Adjusting the number of electrons stored on the floating gate responsive to the control gate may further include adjusting the number of electrons by at least one of adjusting a power supply voltage and adjusting a memory cell signal level.

According to other examples, nonvolatile memory cells are described. Example nonvolatile memory cells may include a transistor body, a floating gate coupled to the transistor body and configured to store electrons, a select gate coupled to the transistor body, and a control gate coupled to the floating gate. The select gate may be configured to receive a signal based on an operation to be performed on the memory cell and apply a potential associated with the received signal to the transistor body. The control gate may be configured to receive a control signal associated with the operation and adjust a number of electrons stored on the floating gate based on the control signal and the potential applied to the transistor body by the select gate.

According to some examples, the nonvolatile memory cell may correspond to one of a pillar-type field-effect transistor (FET) or a fin-type FET. The transistor body may be further configured to have substantially no bulk charge or ionized impurities. The operation to be performed may include a charging operation, a discharging operation, or a cell selection operation. The select gate may be configured to operably apply the potential to the transistor body by application of a first positive potential to the transistor body to place the memory cell in a first state, where the number of electrons stored on the floating gate determines whether the control gate activates access the memory cell or deactivates access to the memory cell; or application of a first negative potential to the transistor body to place the memory cell in a second state, where the control gate is disabled from activation of the memory cell.

According to other examples, the select gate may be further configured to apply the potential to the transistor body by application of a second positive potential greater than the first positive potential effective to place the memory cell in a third state such that a reduction of the number of electrons stored on the floating gate by the control gate is facilitated; or application of a second negative potential greater than the first negative potential effective to place the memory cell in a fourth state such that an increase of the number of electrons stored on the floating gate by the control gate is facilitated. The control gate may be further configured to adjust a number of electrons stored on the floating gate such that the number of electrons correspond to a high logic level. The control gate may also be configured to adjust the number of electrons stored on the floating by at least one of a power supply voltage adjustment and a memory cell signal level adjustment.

According to further examples, logic array modules are described. Example logic array modules may include a plurality of nonvolatile memory cells, each nonvolatile memory cell including a transistor body, a floating gate coupled to the transistor body and configured to store electrons, a control gate coupled to the floating gate, and a select gate coupled to the transistor body. Each of the logic array modules may also include a processor block coupled to the plurality of nonvolatile memory cells. The processor block may be configured to determine a memory operation to be performed; select a nonvolatile memory cell from the plurality of nonvolatile memory cells based on the determined memory operation to be performed; and for each of the selected nonvolatile memory cells: determine a cell operation to be performed on the memory cell based on the determined memory operation to be performed; apply a potential selected from a plurality of potentials based on the determined cell operation to be performed to the select gate of the selected memory cell, where each potential in the plurality of potentials corresponds to a respective body state of the transistor body; and adjust a number of electrons stored on the floating gate of the memory cell through the control gate of the memory cell based on the determined cell operation to be performed and the body state corresponding to the potential applied to the select gate of the memory cell.

According to some examples, each of the plurality of nonvolatile memory cells may correspond to one of a pillar-type field-effect transistor (FET) and a fin-type FET. The transistor body of each nonvolatile memory cell may be configured to have substantially no bulk charge or ionized impurities. The memory operation to be performed may include a read operation, a write operation, or an erase operation. The cell operation to be performed may include a charging operation, a discharging operation, or a cell selection operation. The plurality of potentials may include a first positive potential that corresponds to a first body state, where the number of electrons stored on the floating gate determines whether the control gate is able to turn the memory cell on and off; or a first negative potential that corresponds to a second body state, wherein the control gate is unable to turn the memory cell on.

According to other examples, the plurality of potentials may further include a second positive potential greater than the first positive potential and that corresponds to a third body state, where reduction of the number of electrons stored on the floating gate is facilitated; or a second negative potential greater than the first negative potential and that corresponds to a fourth body state, where increase of the number of electrons stored on the floating gate is facilitated. The processor block may be further configured to adjust, for at least one nonvolatile memory cell in the plurality of nonvolatile memory cells, a number of electrons stored on the floating gate of the at least one nonvolatile memory cell such that the number of electrons correspond to a high logic level. The processor block may also be configured to adjust the number of electrons stored on the floating gate of the at least one nonvolatile memory cell through at least one of a power supply voltage adjustment and a memory cell signal level adjustment.

The use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (for example, hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, some aspects of the embodiments disclosed herein, in whole or in part, may be equivalently implemented in integrated circuits, as one or more computer programs running on one or more computers (for example, as one or more programs running on one or more computer systems), as one or more programs running on one or more processors (for example as one or more programs running on one or more microprocessors), as firmware, or as virtually any combination thereof, and that designing the circuitry and/or writing the code for the software and or firmware would be possible in light of this disclosure.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, will be possible from the foregoing descriptions. Such modifications and variations are intended to fall within the scope of the appended claims. The present disclosure is to be limited only by the terms of the appended claims, along with the full scope of equivalents to which such claims are entitled. This disclosure is not limited to particular methods, systems, or components, which can, of course, vary. Also, the terminology used herein is for the purpose of describing particular embodiments only, and is not intended to be limiting.

In addition, the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory, etc.; and a transmission type medium such as a digital and/or an analog communication medium (for example, a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. A data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops.

A data processing system may be implemented utilizing any suitable commercially available components, such as those typically found in data computing/communication and/or network computing/communication systems. The herein described subject matter sometimes illustrates different components contained within, or connected with, different other components. Such depicted architectures are merely exemplary, and in fact many other architectures may be implemented which achieve the same functionality. In a conceptual sense, any arrangement of components to achieve the same functionality is effectively "associated" such that particular functionality is achieved. Hence, any two components herein combined to achieve a particular functionality may be seen as "associated with" each other such that the particular functionality is achieved, irrespective of architectures or intermediate components. Likewise, any two components so associated may also be viewed as being "operably connected", or "operably coupled", to each other to achieve the particular functionality, and any two components capable of being so associated may also be viewed as being "operably couplable", to each other to achieve the particular functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

In general, terms used herein, and especially in the appended claims (for example, bodies of the appended claims) are generally intended as "open" terms (for example, the term "including" should be interpreted as "including but not limited to," the term "having" should be interpreted as "having at least," the term "includes" should be interpreted as "includes but is not limited to," etc.). If a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (for example, "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (for example, the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A method to adjust a nonvolatile memory cell having a transistor body, a select gate coupled to the transistor body, a floating gate coupled to the transistor body, and a control gate coupled to the floating gate, the method comprising:
   determining a memory operation to be performed on the nonvolatile memory cell;
   selecting the nonvolatile memory cell from a plurality of nonvolatile memory cells based on the determined memory operation to be performed;
   determining a cell operation to be performed on the nonvolatile memory cell based on the determined memory operation to be performed for the nonvolatile memory cell;
   selecting a potential from a plurality of potentials based on the determined cell operation to be performed, wherein each potential in the plurality of potentials corresponds to a respective body state of the transistor body;
   applying the selected potential to the select gate; and
   adjusting a number of electrons stored on the floating gate of the nonvolatile memory cell responsive to the control gate of the nonvolatile memory cell based on the determined cell operation and the body state that corresponds to the selected potential applied to the select gate of the nonvolatile memory cell.

2. The method of claim 1, wherein determining the operation to be performed comprises determining the operation as one of a charging operation, a discharging operation, and a cell selection operation.

3. A method to adjust a nonvolatile memory cell having a transistor body, a select gate coupled to the transistor body, a floating gate coupled to the transistor body, and a control gate coupled to the floating gate, the method comprising:
   determining a memory operation to be performed on the nonvolatile memory cell;
   selecting the nonvolatile memory cell from a plurality of nonvolatile memory cells based on the determined memory operation to be performed;
   determining a cell operation to be performed on the nonvolatile memory cell based on the determined memory operation to be performed for each of the selected nonvolatile memory cells;
   selecting a potential from a plurality of potentials based on the determined cell operation to be performed, wherein each potential in the plurality of potentials corresponds to a respective body state of the transistor body, wherein selecting the potential from the plurality of potentials includes one of:
      selecting a first positive potential that corresponds to a first body state, wherein the number of electrons stored on the floating gate determines whether the control gate is able to turn the nonvolatile memory cell on and off; and
      selecting a first negative potential that corresponds to a second body state, wherein the control gate is unable to turn the nonvolatile memory cell on;
   applying the selected potential to the select gate; and
   adjusting a number of electrons stored on the floating gate of the nonvolatile memory cell responsive to the control gate of the nonvolatile memory cell based on the determined cell operation and the body state that corresponds to the selected potential applied to the select gate of the nonvolatile memory cell.

4. The method of claim 3, wherein selecting the potential from the plurality of potentials further includes one of:
   selecting a second positive potential greater than the first positive potential and that corresponds to a third body state, wherein reduction of the number of electrons stored on the floating gate is facilitated; and
   selecting a second negative potential greater than the first negative potential and that corresponds to a fourth body state, wherein increase of the number of electrons stored on the floating gate is facilitated.

5. The method of claim 3, wherein adjusting the number of electrons stored on the floating gate responsive to the control gate comprises storing a high logic level on the floating gate.

6. The method of claim 3, wherein adjusting the number of electrons stored on the floating gate responsive to the control gate further comprises adjusting the number of electrons by at least one of adjusting a power supply voltage and adjusting a nonvolatile memory cell signal level.

7. A nonvolatile memory cell comprising:
   a transistor body;
   a floating gate coupled to the transistor body and configured to store electrons;
   a control gate coupled to the floating gate; and
   a select gate coupled to the transistor body, the nonvolatile memory cell configured to:
      receive a signal based on an operation to be performed on the nonvolatile memory cell;
      select a potential associated with the received signal;
      apply the selected potential to the select gate of the nonvolatile memory cell wherein the potential corresponds to a respective body state of the transistor body;
      receive a control signal through the control gate associated with the operation; and
      adjust a number of electrons stored on the floating gate based on the control signal and the body state corresponding to the potential applied to the select gate of the nonvolatile memory cell.

8. The nonvolatile memory cell of claim 7, wherein the nonvolatile memory cell corresponds to one of a pillar-type field-effect transistor (FET) and a fin-type FET.

9. The nonvolatile memory cell of claim 7, wherein the transistor body is further configured to have substantially no bulk charge or ionized impurities.

10. The nonvolatile memory cell of claim 7, wherein the operation to be performed includes one of a charging operation, a discharging operation, and a cell selection operation.

11. A nonvolatile memory cell comprising:
   a transistor body;
   a floating gate coupled to the transistor body and configured to store electrons;
   a control gate coupled to the floating gate; and
   a select gate coupled to the transistor body, the nonvolatile memory cell configured to:
      receive a signal based on an operation to be performed on the nonvolatile memory cell;
      select a potential associated with the received signal;
      apply the selected potential to the select gate of the nonvolatile memory cell wherein the potential corresponds to a respective body state of the transistor body, wherein the select gate is configured to operably apply the potential to the transistor body by one of:
         application of a first positive potential to the transistor body to place the nonvolatile memory cell in a first state, wherein the number of electrons stored on the floating gate determines whether the control gate activates access the nonvolatile memory cell or deactivates access to the nonvolatile memory cell; and application of a first negative potential to the transistor body to place the nonvolatile memory cell in a second state, wherein the control gate is disabled from activation of the nonvolatile memory cell;

receive a control signal through the control gate associated with the operation; and adjust a number of electrons stored on the floating gate based on the control signal and the body state corresponding to the potential applied to the select gate of the nonvolatile memory cell.

12. The nonvolatile memory cell of claim 11, wherein the select gate is further configured to apply the potential to the transistor body by one of:

application of a second positive potential greater than the first positive potential effective to place the nonvolatile memory cell in a third state such that a reduction of the number of electrons stored on the floating gate by the control gate is facilitated; and application of a second negative potential greater than the first negative potential effective to place the nonvolatile memory cell in a fourth state such that an increase of the number of electrons stored on the floating gate by the control gate is facilitated.

13. The nonvolatile memory cell of claim 11, wherein the control gate is further configured to adjust a number of electrons stored on the floating gate such that the number of electrons correspond to a high logic level.

14. The nonvolatile memory cell of claim 11, wherein the control gate is configured to adjust the number of electrons stored on the floating by at least one of a power supply voltage adjustment and a nonvolatile memory cell signal level adjustment.

15. A logic array module comprising:
a plurality of nonvolatile memory cells, each nonvolatile memory cell comprising:
  a transistor body;
  a floating gate coupled to the transistor body and configured to store electrons;
  a control gate coupled to the floating gate; and
  a select gate coupled to the transistor body; and
a processor block coupled to the plurality of nonvolatile memory cells, the processor block configured to:
  determine a memory operation to be performed;
  select a nonvolatile memory cell from the plurality of nonvolatile memory cells based on the determined memory operation to be performed;
  for each of the selected nonvolatile memory cells:
    determine a cell operation to be performed on the nonvolatile memory cell based on the determined memory operation to be performed;
    apply a potential selected from a plurality of potentials based on the determined cell operation to be performed to the select gate of the selected nonvolatile memory cell, wherein each potential in the plurality of potentials corresponds to a respective body state of the transistor body; and
    adjust a number of electrons stored on the floating gate of the nonvolatile memory cell through the control gate of the nonvolatile memory cell based on the determined cell operation to be performed and the body state corresponding to the potential applied to the select gate of the nonvolatile memory cell.

16. The logic array module of claim 15, wherein each of the plurality of nonvolatile memory cells correspond to one of a pillar-type field-effect transistor (FET) and a fin-type FET.

17. The logic array module of claim 15, wherein the transistor body of each nonvolatile memory cell is configured to have substantially no bulk charge or ionized impurities.

18. The logic array module of claim 15, wherein the memory operation to be performed includes one of a read operation, a write operation, and an erase operation.

19. The logic array module of claim 15, wherein the cell operation to be performed includes one of a charging operation, a discharging operation, and a cell selection operation.

20. The logic array module of claim 15, wherein the plurality of potentials includes:
a first positive potential that corresponds to a first body state, wherein the number of electrons stored on the floating gate determines whether the control gate is able to turn the nonvolatile memory cell on and off; and
a first negative potential that corresponds to a second body state, wherein the control gate is unable to turn the nonvolatile memory cell on.

21. The logic array module of claim 20, wherein the plurality of potentials further includes:
a second positive potential greater than the first positive potential and that corresponds to a third body state, wherein reduction of the number of electrons stored on the floating gate is facilitated; and
a second negative potential greater than the first negative potential and that corresponds to a fourth body state, wherein increase of the number of electrons stored on the floating gate is facilitated.

22. The logic array module of claim 15, wherein the processor block is further configured to adjust, for at least one nonvolatile memory cell in the plurality of nonvolatile memory cells, a number of electrons stored on the floating gate of the at least one nonvolatile memory cell such that the number of electrons correspond to a high logic level.

23. The logic array module of claim 22, wherein the processor block is configured to adjust the number of electrons stored on the floating gate of the at least one nonvolatile memory cell through at least one of a power supply voltage adjustment and a nonvolatile memory cell signal level adjustment.

* * * * *